United States Patent
Chen et al.

(10) Patent No.: US 7,486,454 B2
(45) Date of Patent: Feb. 3, 2009

(54) VARIABLE FOCUS DEVICE

(75) Inventors: Hann-Kuang Chen, Kaohsiung Hsien (TW); Wen-Chang Cheng, Kaohsiung Hsien (TW); Ching-Kuo Chu, Kaohsiung Hsien (TW); Chih-Chan Liao, Kaohsiung Hsien (TW); Hsin-Ping Ko, Kaohsiung Hsien (TW); Chen-Wei Lai, Kaohsiung Hsien (TW); San-Fan Chiu, Kaohsiung Hsien (TW)

(73) Assignee: Sunnytec Electronics Co., Ltd., Kaohsiung (TW)

( * ) Notice: Subject to any disclaimer, the term of this patent is extended or adjusted under 35 U.S.C. 154(b) by 104 days.

(21) Appl. No.: 11/787,669

(22) Filed: Apr. 17, 2007

(65) Prior Publication Data

US 2008/0259471 A1 Oct. 23, 2008

(51) Int. Cl.
*G02B 7/02* (2006.01)
(52) U.S. Cl. ...................... 359/824; 359/811
(58) Field of Classification Search .................. 359/824
See application file for complete search history.

(56) References Cited

U.S. PATENT DOCUMENTS

| 6,078,440 A * | 6/2000 | Ueyama ................ 359/824 |
| 2006/0215283 A1 * | 9/2006 | Makil ..................... 359/824 |

* cited by examiner

*Primary Examiner*—Jordan M. Schwartz
*Assistant Examiner*—James C Jones
(74) *Attorney, Agent, or Firm*—Schwegman, Lundberg & Woessner, P.A.

(57) ABSTRACT

A variable focus device is adapted for focusing an image on an image sensing module, and includes a hollow fixing seat, a lens module and a lens coupling unit. The fixing seat is adapted for mounting the image sensing module therein. The lens coupling unit includes a piezoelectric layer and a metal layer disposed on the piezoelectric layer. The piezoelectric and metal layers are respectively formed with aligned lens mounting holes to permit mounting of the lens module to the lens coupling unit. The lens coupling unit is disposed relative to the fixing seat such that the lens module corresponds in position to the fixing seat. The piezoelectric layer deforms in response to application of a control signal thereto to move the lens module relative to the fixing seat, thereby varying a focal position of the lens module relative to the image sensing module in the fixing seat.

7 Claims, 2 Drawing Sheets

VARIABLE FOCUS DEVICE

BACKGROUND OF THE INVENTION

1. Field of the Invention

The invention relates to a variable focus device, more particularly to a variable focus device that utilizes piezoelectricity techniques for lens adjustment.

2. Description of the Related Art

Portable electronic products, such as personal digital assistants and mobile phones, are currently integrated with an image capturing function to improve consumer appeal. Since these products are light, thin and small, the lens modules installed therein must also be small and light so as not to affect portability of these products.

In the prior art, a stepper motor mechanism is employed to drive a lens module of a camera for focus adjustment. The known stepper motor mechanism is bulky and relatively heavy, which discourages its application to other portable electronic products. Therefore, most portable electronic products employ fixed lens modules in view of cost and size considerations.

SUMMARY OF THE INVENTION

The object of the present invention is to provide a variable focus device that is small, light and thin so as to be suitable for application to portable electronic products.

Accordingly, a variable focus device of this invention is adapted for focusing an image on an image sensing module, and comprises a hollow fixing seat, a lens module and a lens coupling unit.

The fixing seat is adapted for mounting the image sensing module therein. The lens coupling unit includes a piezoelectric layer and a metal layer disposed on the piezoelectric layer. The piezoelectric and metal layers are respectively formed with aligned lens mounting holes to permit mounting of the lens module to the lens coupling unit. The lens coupling unit is disposed relative to the fixing seat such that the lens module corresponds in position to the fixing seat.

The piezoelectric layer deforms in response to application of a control signal thereto to move the lens module relative to the fixing seat, thereby varying a focal position of the lens module relative to the image sensing module in the fixing seat.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
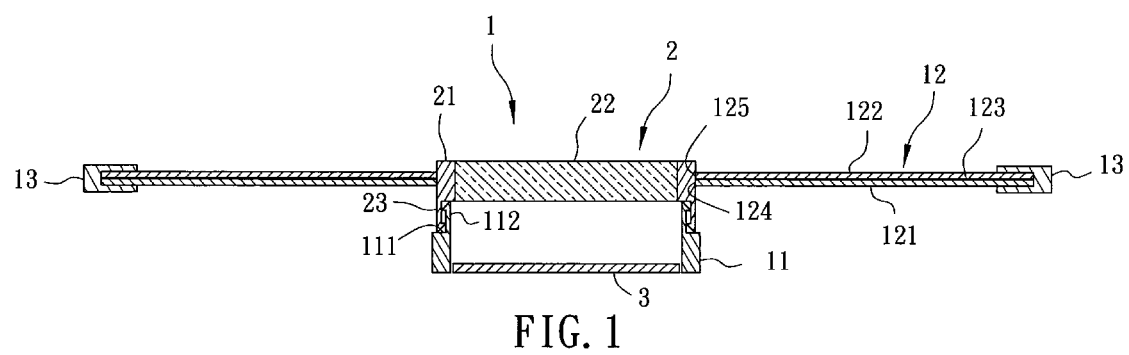
FIG. 1 is a schematic view of the preferred embodiment of a variable focus device according to the present invention.

Referring to FIG. 1, the preferred embodiment of a variable focus device 1 according to the present invention is shown to be adapted for focusing an image on an image sensing module 3, and comprises a hollow fixing seat 11, a lens module 2, and a lens coupling unit 12.

The fixing seat 11 is adapted for mounting the image sensing module 3 therein. The lens coupling unit 12 includes a piezoelectric layer 121, a metal layer 122 disposed on the piezoelectric layer 121, and an adhesive layer 123 for bonding the metal layer 122 adhesively to the piezoelectric layer 121. The piezoelectric and metal layers 121, 122 are respectively formed with aligned lens mounting holes 124, 125 to permit mounting of the lens module 2 to the lens coupling unit 12. A pair of brackets 13 fix opposite ends of the lens coupling unit 12 relative to the fixing seat 11 such that the lens module 2 corresponds in position to the fixing seat 11. The lens coupling unit 12 is connected electrically to a control signal generator (not shown).

The lens module 2 includes a lens seat 21 mounted in the lens mounting holes 124, 125 in the piezoelectric layer 121 and the metal layer 122, a lens 22 mounted in the lens seat 21, and a first hook portion 23 that extends from the lens seat 21 toward the fixing seat 11.

The fixing seat 11 has a shoulder portion 111 that abuts movably against the first hook portion 23, and a second hook portion 112 that is provided on the shoulder portion 111 to engage removably the first hook portion 23. In this embodiment, the second hook portion 112 engages an inner side of the first hook portion 23. However, in practice, the engagement can be modified, such as the first hook portion 23 faces outwardly while the second hook portion 112 faces inwardly so that the first hook portion 23 engages an inner side of the second hook portion 112.

In this embodiment, the piezoelectric layer 121 is made of lead zirconium titanate (abbreviated as PZT, powder code P5H, P101D or P8), and has a thickness less than 0.3 mm. The metal layer 122 is made of copper, and has a thickness less than 0.3 mm. The adhesive layer 123 is AB glue. In other embodiments of this invention, the piezo electric layer 121 may be made of barium titanate ($BaTiO_3$), and the metal layer 122 may be made of nickel or SUS304 stainless steel.

Figure 2:
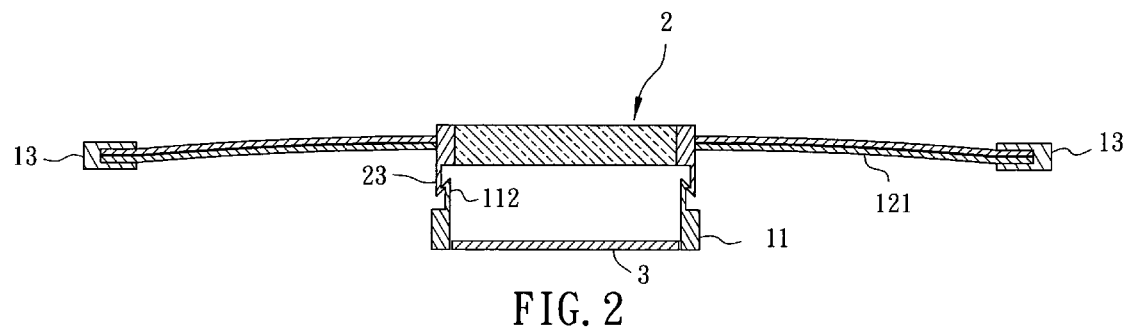
FIG. 2 is a view similar to FIG. 1, but illustrating deformation of a lens coupling unit in response to application of a control signal.

Referring to FIG. 2, to vary a focal position of the lens module 2 relative to the image sensing module 3 in the fixing seat 11, a control signal, such as a 100-volt signal, is applied to the piezoelectric layer 121 so as to cause the latter and thus the lens coupling unit 12 to deform. Since the opposite ends of the lens coupling unit 12 are clamped in position by the brackets 13, a central portion of the lens coupling unit 12 deforms to a larger extent, which can reach 0.370 mm for the 100-volt applied signal. When the lens coupling unit 12 deforms such that the central portion thereof moves away from the fixing seat 11, the focal position of the lens module 2 relative to the image sensing module 3 in the fixing seat 11 is changed. In the meantime, due to engagement between the first hook portion 23 and the second hook portion 112, removal of the lens module 2 from the fixing seat 11 can be prevented when changing the focal position of the lens module 2.

Figure 3:
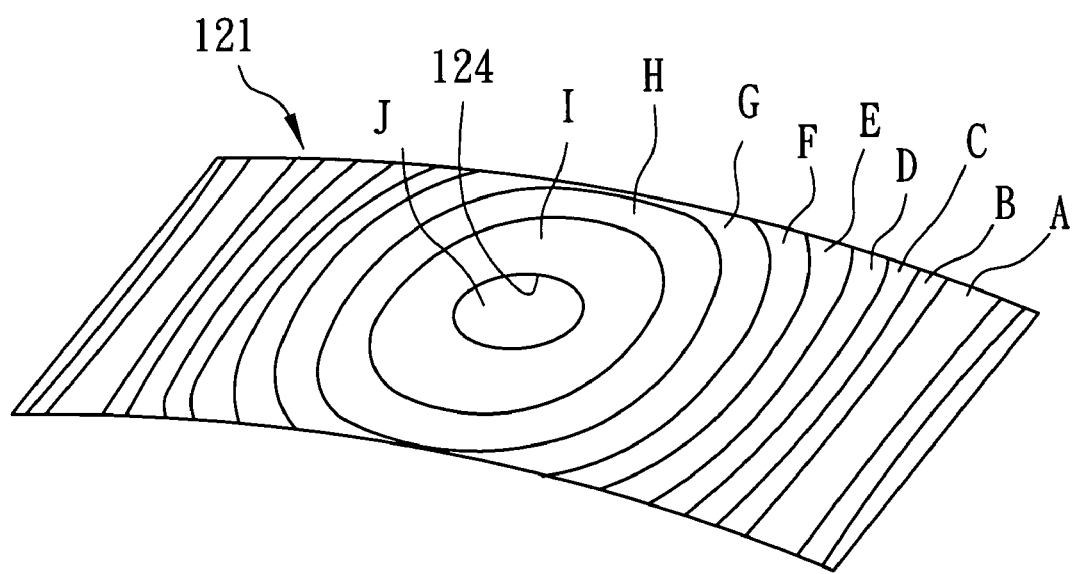
FIG. 3 illustrates amplitudes of deformation of various regions of a piezoelectric layer of the lens coupling unit in response to application of a control signal.

FIG. 3 illustrates amplitudes of deformation of various regions of the piezoelectric layer 121 in response to the control signal. While the opposite ends of the piezoelectric layer 121 do not deform in response to the control signal due to clamping by the brackets 13, the amplitude of deformation becomes larger as the distance to the lens mounting hole 124 becomes closer. The amplitudes of deformation for regions A to J in FIG. 3 are as follows: region A—0.00464 mm, region B—0.0452 mm, region C—0.0657 mm, region D—0.126 mm, region E—0.167 mm, region F—0.207 mm, region G—0.248 mm, region H—0.289 mm, region I—0.329 mm and region J—0.370 mm. These data show that the piezoelectric layer 121 can be energized to move the lens module 2 mounted in the lens mounting hole 124 so as to vary a focal position of the lens module 2 relative to the image sensing module 3 in the fixing seat 11.

In practice, the extent of deformation of the lens coupling unit 12 depends on the magnitude of the applied control signal. If the applied control signal is a 150-volt signal, deformation of the central portion of the lens coupling unit 12 can reach 0.400 mm.

In sum, the present invention uses a thin lens coupling unit 12 that includes a piezoelectric layer 121 and a metal layer 122 instead of a stepper motor mechanism to drive a lens module 2 for focus adjustment. Due to its relatively small size, the variable focus device 1 of this invention is suitable for application to many types of portable electronic devices, such as portable digital assistants and mobile phones. Moreover, since the lens coupling unit 12 is relatively easy to fabricate, manufacturing costs can be kept low.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

What is claimed is:

1. A variable focus device adapted for focusing an image on an image sensing module, said variable focus device comprising:
    a hollow fixing seat adapted for mounting the image sensing module therein;
    a lens module; and
    a lens coupling unit including a piezoelectric layer and a metal layer disposed on said piezoelectric layer, said piezoelectric and metal layers being respectively formed with aligned lens mounting holes to permit mounting of said lens module to said lens coupling unit, said lens coupling unit being disposed relative to said fixing seat such that said lens module corresponds in position to said fixing seat;
    wherein said piezoelectric layer deforms in response to application of a control signal thereto to move said lens module relative to said fixing seat, thereby varying a focal position of said lens module relative to the image sensing module in said fixing seat.

2. The variable focus device of claim 1, wherein said metal layer is bonded adhesively to said piezoelectric layer.

3. The variable focus device of claim 1, wherein:
    said lens module includes a lens seat mounted in said lens mounting holes in said piezoelectric layer and said metal layer, a lens mounted in said lens seat, and a first hook portion that extends from said lens seat toward said fixing seat; and
    said fixing seat has a shoulder portion that abuts movably against said first hook portion, and a second hook portion that is provided on said shoulder portion to engage removably said first hook portion.

4. The variable focus device of claim 1, wherein said piezoelectric layer has a thickness less than 0.3 mm.

5. The variable focus device of claim 1, wherein said metal layer has a thickness less than 0.3 mm.

6. The variable focusing device of claim 1, wherein said piezoelectric layer is made of a material selected from the group consisting of PZT and $BaTiO_3$.

7. The variable focus device of claim 1, wherein said metal layer is made of a material selected from the group consisting of copper, nickel and stainless steel.

* * * * *